United States Patent [19]

Malhi

[11] Patent Number: 4,910,567
[45] Date of Patent: Mar. 20, 1990

[54] DRAM CELL AND METHOD FOR FABRICATING

[75] Inventor: Satwinder Malhi, Garland, Tex.

[73] Assignee: Texas Instruments, Incorporated, Dallas, Tex.

[21] Appl. No.: 833,944

[22] Filed: Feb. 26, 1986

[51] Int. Cl.⁴ .................................. H01L 29/78
[52] U.S. Cl. .................. 357/23.6; 357/23.4; 357/55; 357/56
[58] Field of Search .......... 357/23.6, 23.4, 56, 357/55

[56] References Cited

U.S. PATENT DOCUMENTS 4,353,086  10/1982  Jaccopine et al. ............ 357/49

FOREIGN PATENT DOCUMENTS 56-51854  5/1981  Japan ..................... 357/23.6
58-03269  1/1983  Japan ..................... 357/23.6
59-19366  1/1984  Japan ..................... 357/23.6
60-261165 12/1985  Japan ..................... 357/23.6

Primary Examiner—Andrew J. James
Assistant Examiner—Mark Prenty
Attorney, Agent, or Firm—Douglas A. Sorensen; Rodney M. Anderson; Melvin Sharp

[57] ABSTRACT

The described embodiment of the present invention provides a memory cell which is fabricated using a self-isolating structure and provides misalignment tolerance in the design of the cell thereby eliminating the need for additional area to be reserved for isolation structures and misalignment tolerances.

1 Claim, 6 Drawing Sheets

DRAM CELL AND METHOD FOR FABRICATING

FIELD OF THE INVENTION

The present invention relates to the field of integrated circuit fabrication. More specifically, the present invention relates to dynamic random access memories (DRAMs) and DRAM cells.

BACKGROUND OF THE INVENTION

The desireability of extremely small memory cells in DRAMs is widely known in the art. DRAM fabrication has reached the point where memory cells may no longer occupy a large surface area of the integrated circuit but must be vertically integrated. To this end trench capacitor and trench transistor cells have been developed (See e.g. U.S. App. Ser. No. 679,663 and Japanese Published Application No. 59-19366(A), both of which are hereby incorporated by reference). The quest to develop smaller vertically integrated DRAM cells is limited by, among others, two factors. First, most DRAM cells require isolation structures between the cells to avoid crosstalk of data between cells; this occupies substantial surface area of the integrated circuit. Second, allowance must be made for alignment tolerances. Thus, although a cell may ideally be laid out in a very small space, area must be reserved on the integrated circuit for misalignment of components formed on the surface or in the top of the integrated circuit.

SUMMARY OF THE INVENTION

The described embodiment of the present invention provides a memory cell which is fabricated using a self-isolating structure and provides misalignment tolerance in the design of the cell thereby eliminating the need for additional area to be reserved for isolation structures and misalignment tolerances.

DETAILED DESCRIPTION

Figure 1A:
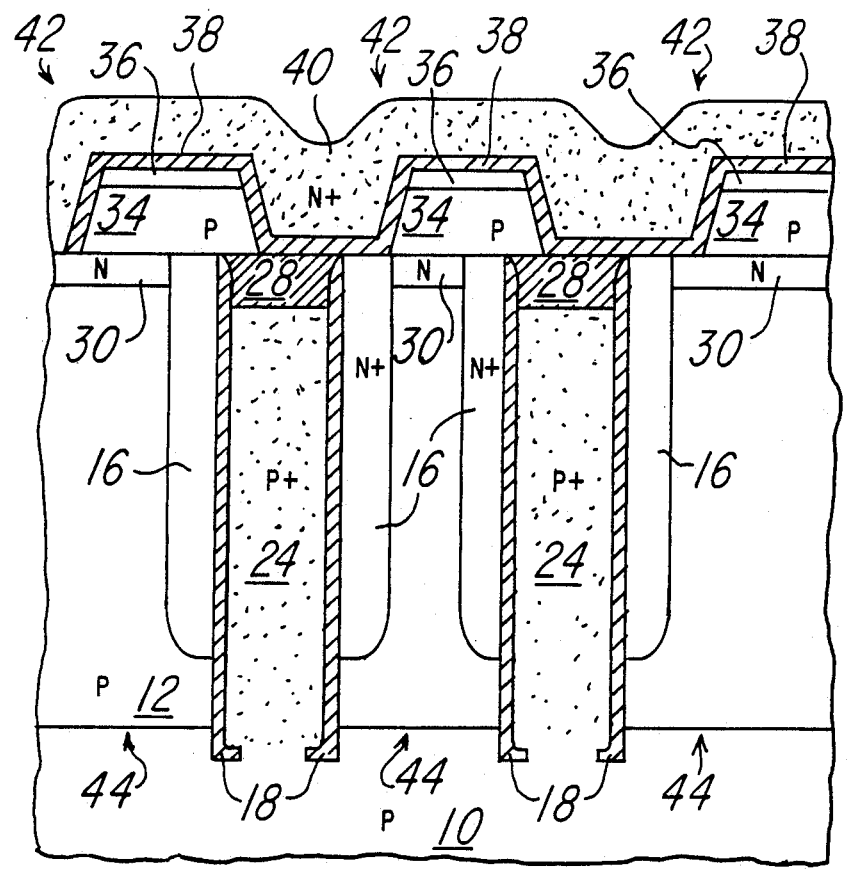
FIG. 1A is a sideview schematic drawing of one embodiment of the present invention.
Figure 1B:
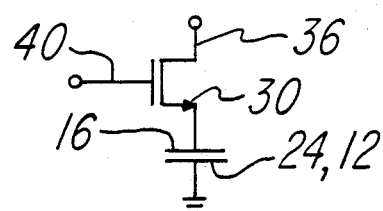
FIG. 1B is an electrical schematic diagram representing the cell shown in FIG. 1A.

The present invention is described with regard to the embodiment shown in Figure 1A. FIG. 1B is an electrical schematic diagram indicating the electrical operation of the cell shown in FIG. 1A. The fabrication of the embodiment shown in 1A is then described in FIGS. 2A through 2I. Finally, an overview of the arrangement of the described embodiment in an array of memory cells is shown with regard to FIG. 3.

The embodiment of the present invention shown in FIG. 1A includes transistor 42 integrally formed with capacitor 44. Transistor 42 comprises drain region 36 which in this embodiment comprises an n+ region. Of course other doping configurations may be used to provide equivalent results such as those shown in this embodiment. Such doping configurations are considered within the scope of the present invention. The channel region is provided by one edge of region 34. An important aspect of the present invention is that during the fabrication of regions 34 and 36, any misalignment relative to the lower portion of the cell will simply move the channel region from one side of region 34 to the other. In the shown embodiment the channel region is formed on the left side of the drawing in region 34. The source of transistor 42 is formed by the combination of n region 30 and n+ region 16.

Capacitor 44 comprises n+ region 16 which is formed in a spike of single crystalline semiconductor material. The portion of epitaxial layer 12 in which region 16 is formed is a cylinder of material formed by etching the trenches which are now occupied by p+ polycrystalline silicon regions 24. This procedure forms a mesa for a spike and an array of memory cells according to the present embodiment to include a plurality of such spikes. The opposite plate to n+ regions 16 of capacitor 44 is formed by two elements. First, p-type epitaxial layer 12 forms a grounded plate which is separated from n+ regions 16 by the depletion layer formed between n+ regions 16 and p epitaxial layer 12. Second, p+ polycrystalline silicon region 24 which is separated from n+ egion 16 by silicon dioxide layer 18 forms another grounded plate. FIG. 1B is an electrical schematic diagram indicating the electrical function of the components shown in FIG. 1A.

Figure 2A:
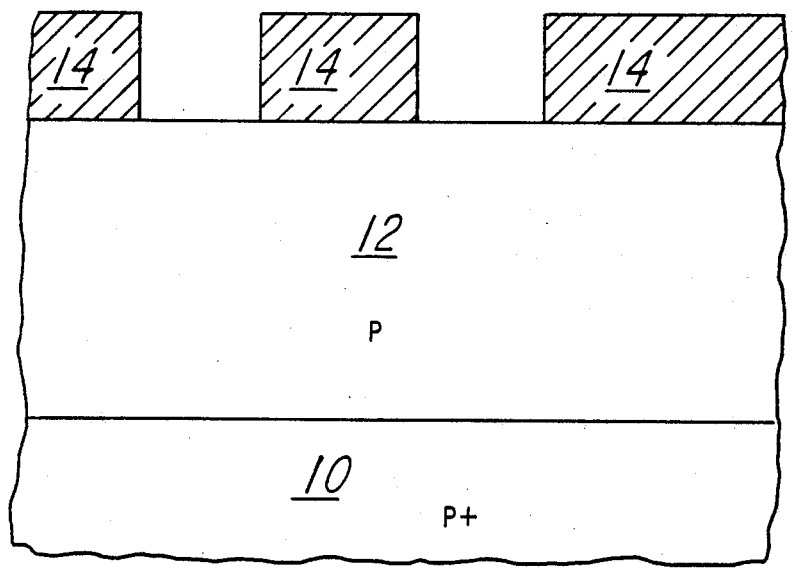
FIGS. 2A through 2I are sideview schematic drawings depicting one method of fabricating the cell of FIG. 1A.

The embodiment of FIG. 1A is fabricated using the steps depicted in the sideview schematic diagrams of FIGS. 2A through 2I. FIG. 2A shows the initial starting material which includes p+ substrate 10, p epitaxial layer 12 formed on p+ substrate 10 and silicon dioxide layer 14. Silicon dioxide layer 14 is formed on the surface of p-type epitaxial layer 12 by low pressure chemical vapor deposition (LPCVD) to a thickness of approximately 10,000 Angstroms using techniques wellknown in the art. Epitaxial layer 12 is formed on the surface of substrate 10 to a thickness of approximately 8 microns using techniques wellknown in the art. Silicon dioxide layer 14 is patterned using photolithographic techniques well-known in the art. Silicon dioxide layer 14 provides an etching mask for an anisotropic etching process to provide the structure shown in FIG. 2B. N+ regions 16 are formed by exposing the trenched epitaxial layer 12 to phosphorous oxychloride (POCL3).

Figure 2B:
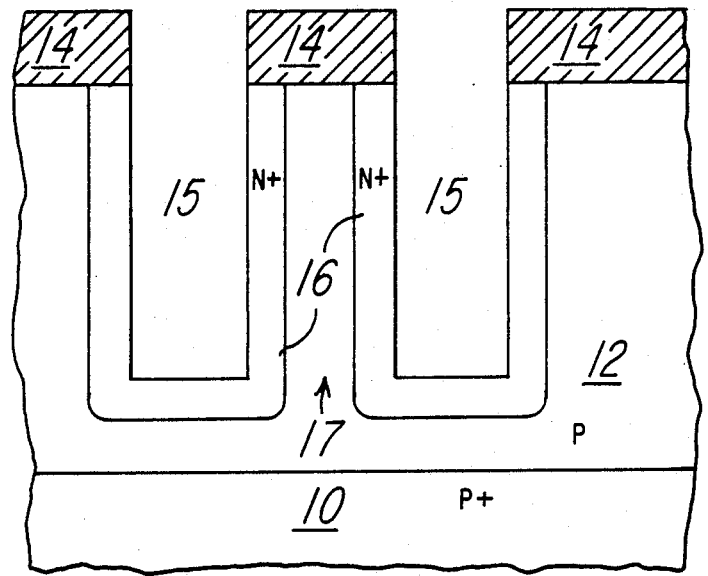

The structure of FIG. 2B is then further subjected to an anisotropic etching process to remove the bottom portion of n+ regions 16 and extend the trenches in p epitaxial layer 12 completely through p-type epitaxial layer 12. Trenches 15 completely encircle portions of p-type epitaxial layer 12 thereby providing a single crystal spike or mesa 17. A thermal oxidation is then formed to oxidize the walls of trenches 15 and provide silicon dioxide layers 18 having a thickness of approximately 150 Angstroms. Polycrystalline silicon layer 20 is then deposited using LPCVD techniques to a thickness of approximately 1000 Angstroms. Polycrystalline silicon layer 20 is doped p+ using techniques wellknown in the art such as in situ doping.

Figure 2C:
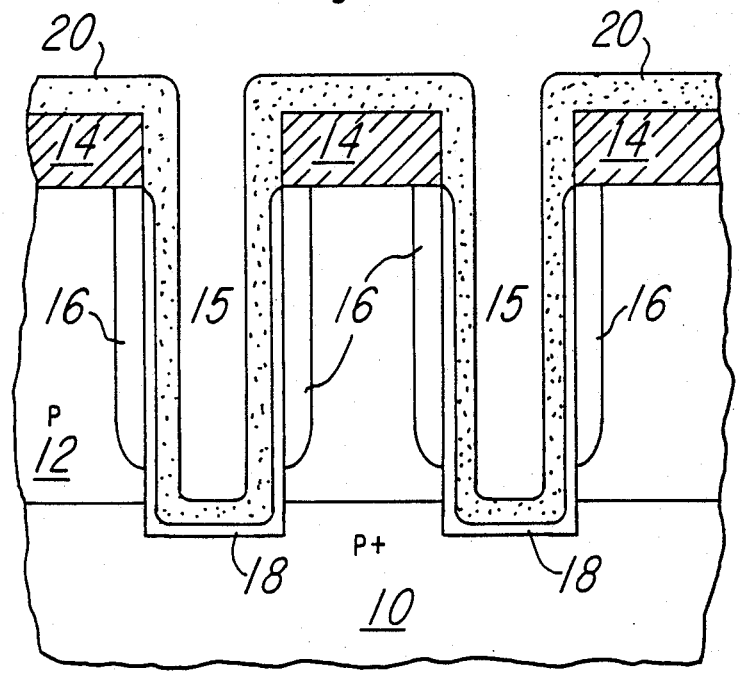

The structure of FIG. 2C is then subjected to another anisotropic etching process, which may be composed of a two-step process to remove the bottom portions of polycrystalline silicon layer 20 and silicon dioxide layer 18. During this process the top layer of polycrystalline layer 20 is removed and a portion of silicon dioxide layer 14 is also removed. The remaining structure includes polycrystalline silicon filaments 20 along the side walls of trenches 15. Polycrystalline silicon layer 20 is then deposited using LPCVD to a thickness of approximately 7000 Angstroms. Polycrystalline silicon layer 22 must have a thickness slightly greater than half the opening of trenches 15. In the shown embodiment, trenches 15 are approximately one micron wide. Polycrystalline silicon layer 22 is doped p-type.

Figure 2D:
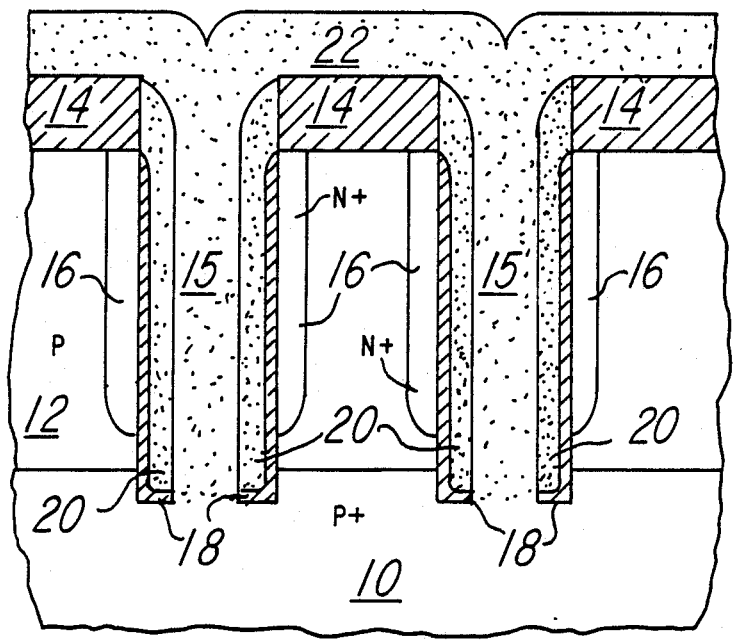
Figure 2E:
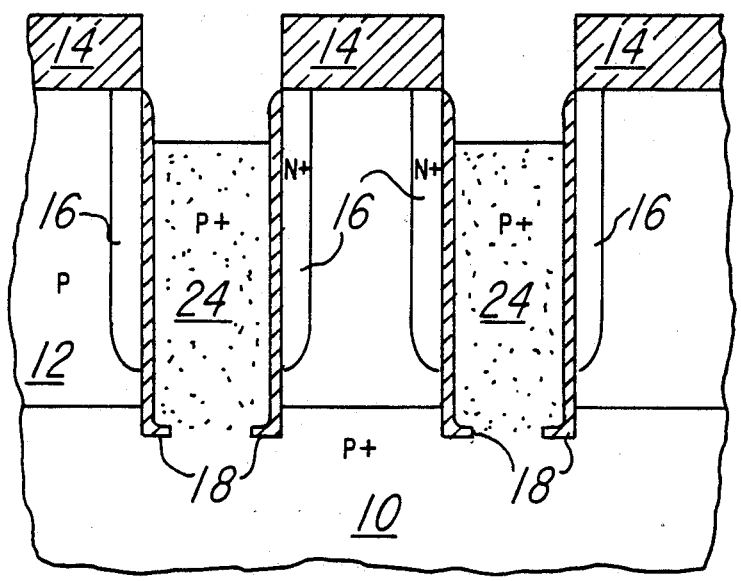
Figure 2F:
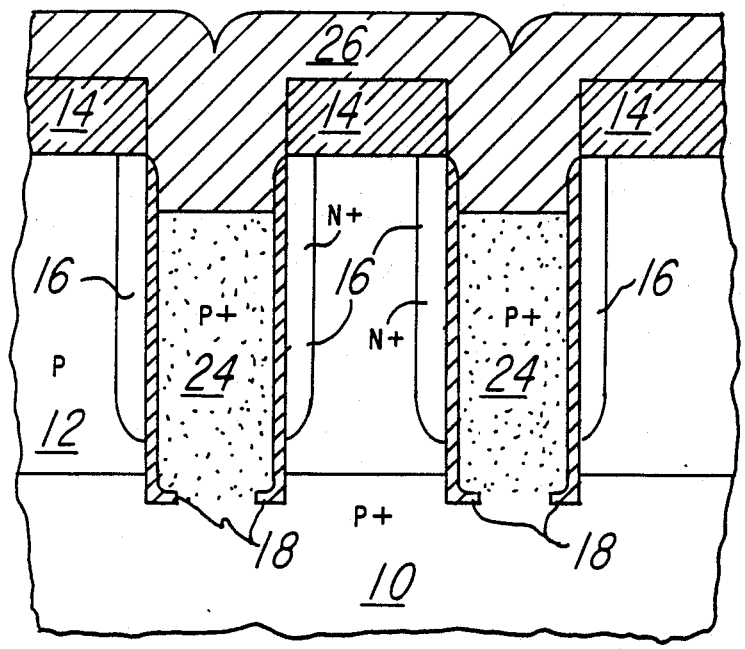
Figure 2G:
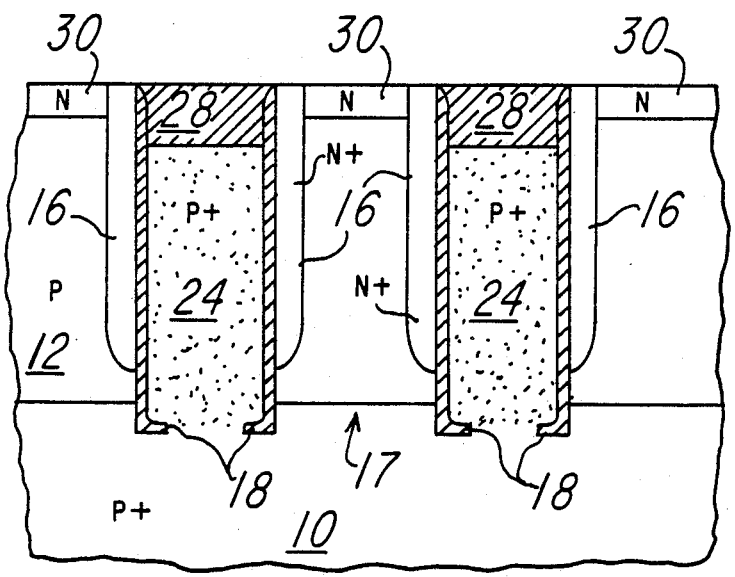

The structure of FIG. 2D is then subjected to a polycrystalline silicon etchback process which selectively etches polycrystalline silicon. The doping levels of polycrystalline silicon layers 20 and sidewall polycrystalline silicon layers 20 merge and the resulting structure is polycrystalline plugs 24 as shown in FIG. 2E. As shown in FIG. 2F, a silicon dioxide layer is deposited using LPCVD to a thickness of approximately 7000 Angstroms. The thickness of silicon dioxide layer 26 should be enough so that the top layer of silicon dioxide layer 26 is nearly planar. Silicon dioxide layer 26 and silicon dioxide layer 14 are subjected to a resist etchback planarization process and are etched back so that silicon dioxide layer 14 is completely removed and the only portion of silicon dioxide layer 26 remaining are silicon dioxide plugs 28 as shown in FIG. 2G. The structure of FIG. 2G is subjected to an Arsenic ion implantation having an energy of approximately 50 kiloelectron Volts and a density of approximately $1 \times 10^{15}$ ions per centimeter squared to form n-type regions 30 as shown in FIG. 2G.

Figure 2H:
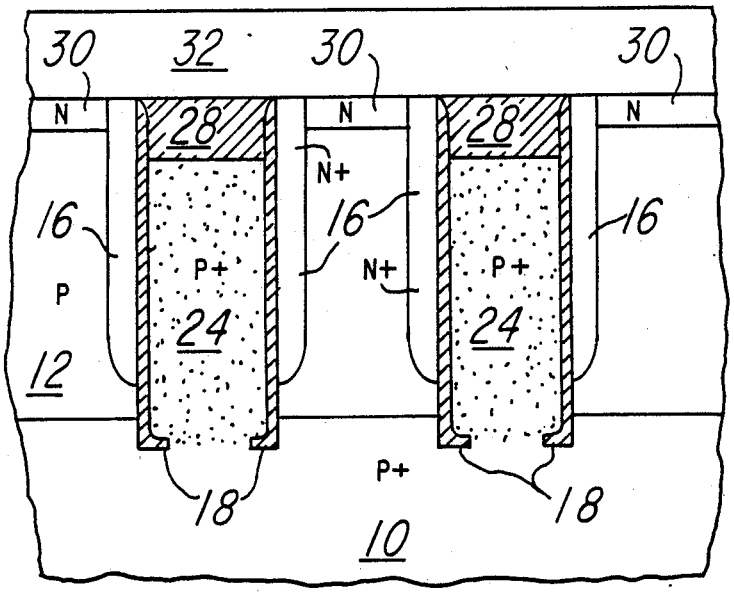

The structure of FIG. 2G is then subjected to an epitaxial deposition process wherein the deposited silicon material is selectively deposited on silicon crystalline regions on the surface of mesas 17. The silicon material nucleates at the exposed single crystal silicon and forming successive layers merges together and forms a single crystal continuous layer 32 as shown in FIG. 2H. This process of selective silicon deposition to provide a single crystal epitaxial layer is described in more detail in Ipri. Device Characterization on Monocrystalline Silicon Grown over SI02 by ELO (Epitaxial Lateral Overgrowth) Process. IEDM 1982, which is hereby incorporated by reference. Epitaxial layer 32 is doped to p-type either by in situ doping processes or other techniques well-known in the art.

Figure 2I:
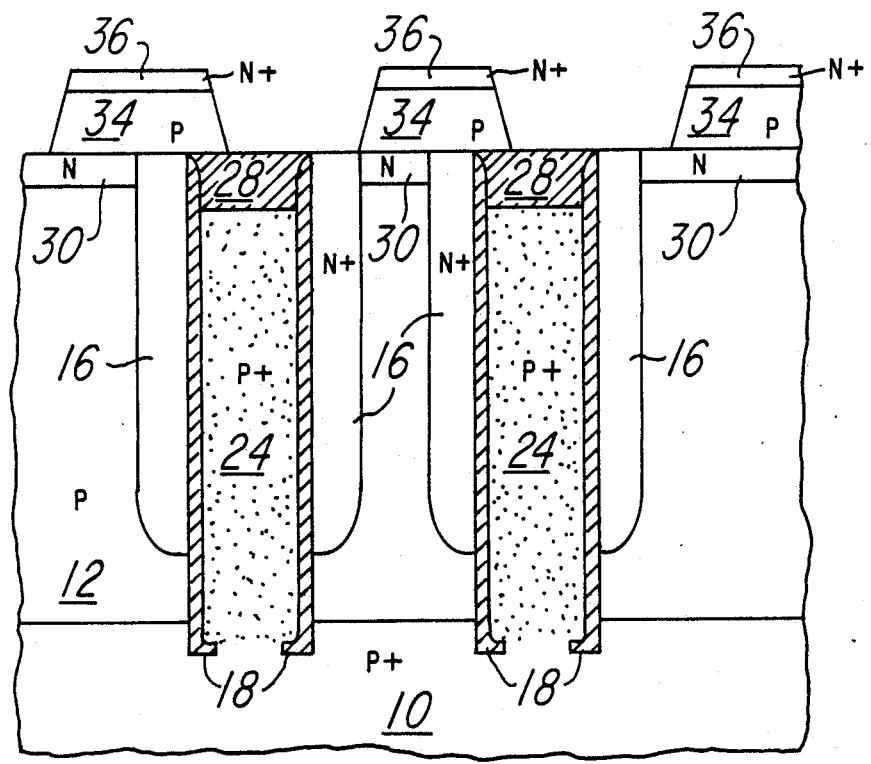
Figure 3:
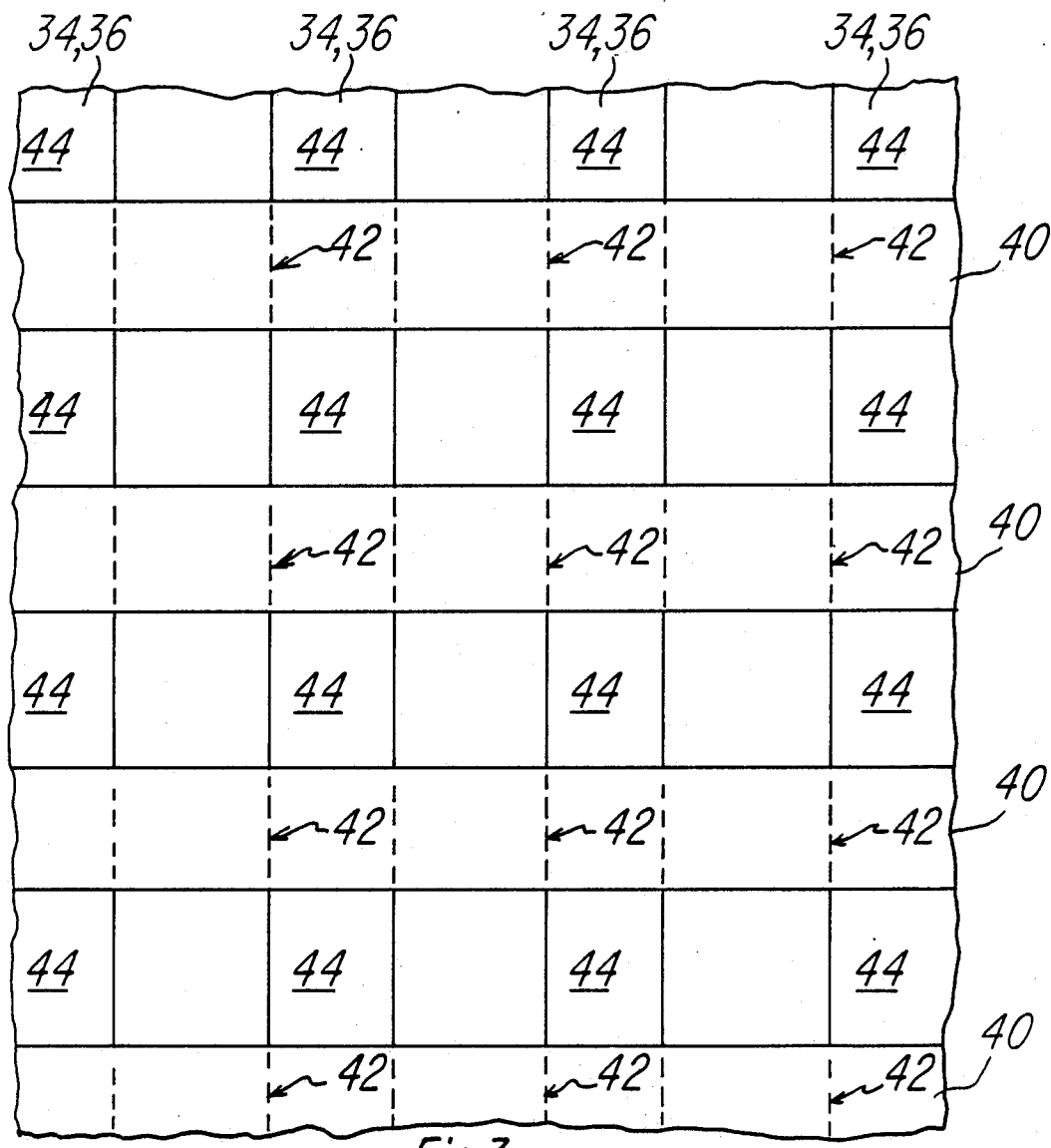
FIG. 3 is a plan view diagram of an array of memory cells such as those shown in FIG. 1A.

Epitaxial layer 32 is subjected to an ion implantation process of arsenic ions to form an n+ layer on the surface of epitaxial layer 32 of a thickness of approximately 2000 Angstroms and a doping level of approximately $1 \times 10^{15}$ dopant atoms per cubic centimeter. Epitaxial layer 32 is then patterned and anisotropically etched to provide p-type regions 34 and n+type regions 36 having sloped sidewalls as shown in FIG. 2I. The structure of Figure 2I is then subjected to a thermal oxidation process to form silicon dioxide layer 38 as shown in FIG. 1A. Polycrystalline silicon layer 40 is then deposited to a thickness of approximately 3000 Angstroms using LPCVD and is patterned to provide strips along the array containing the described memory cell, these strips run parallel to the plane of the page. P regions 34 and N+ regions 36 run in strips along the length of the array perpendicular to the plane of the page. The relationship of polycrystalline silicon strips 40 and P regions 34 with N+ regions 36 is shown in the plan view of FIG. 3. The structure of FIG. 3 is subjected to an ion implantation process of approximately $5 \times 10^{12}$ boron ions per centimeter squared in an energy of approximately 30 kiloelectron volts. This raises the doping level on the sloped sidewalls of regions 44 as shown in FIG. 3 to insure that an inversion layer is not formed in region 44 thus providing a path of crosstalk between adjacent memory cells. Thus, polycrystalline silicon strips 40 serve as wordlines and n+regions 36 running the length of the array serve as bitlines for memory array as shown in the described embodiment.

Although specific embodiments of the present invention are shown in this specification, it is not intended that the specification limit the scope of the invention in any way. Several alternate embodiments are possible and will become obvious to those skilled in the art. An example is that the use of this structure is not limited to silicon and other materials such as gallium arsenide, indium phosphide or mercury cadmium telluride may be used instead of silicon. Additionally, many materials may be substituted for word line 40 such as tungsten or aluminum and bitline 36 may include strapping to lower the bitline resistance of an array containing the present embodiment. Many other modifications and embodiments of the present invention will become clear to those skilled in the art.

I claim:

1. A memory array comprising:
   a plurality of memory cells formed in a substrate having trenches formed therein which define a mesa in said substrate for each of said memory cells;
   a region of a conductivity opposite the conductivity of said substrate formed in the sidewalls and on the surface of said mesa;
   dielectric material formed in said trenches;
   an epitaxial layer formed into a plurality of substantially parallel strips, each parallel strip contacting the top surface of a plurality of said mesas, said epitaxial layer containing a bottom region of the same conductivity type as said substrate contacting said mesas and a top region of opposite conductivity type of said substrate, said top region of each of said strips serving as a bit line;
   an insulating layer formed on the surface of said epitaxial layer and on any of the top surfaces of said mesas left exposed by the formation of said epitaxial layer; and
   a plurality of conductive strips formed on the surface of said insulating layer, said strips running substantially perpendicular to said parallel strips of said epitaxial layer each of said strips serving as word line.

* * * * *